United States Patent [19]
Yamamoto

[11] Patent Number: 5,923,967
[45] Date of Patent: Jul. 13, 1999

[54] METHOD FOR PRODUCING A THIN FILM SEMICONDUCTOR DEVICE

[75] Inventor: Tomohiko Yamamoto, Tenri, Japan

[73] Assignee: Sharp Kabushiki Kaisha, Osaka, Japan

[21] Appl. No.: 08/749,867

[22] Filed: Nov. 15, 1996

[30] Foreign Application Priority Data

Nov. 17, 1995 [JP] Japan .................................. 7-299800

[51] Int. Cl.⁶ .............................. H01L 21/00; H01L 21/84
[52] U.S. Cl. ............................ 438/162; 438/164; 438/166
[58] Field of Search ..................................... 438/162, 910, 438/164, 166

[56] References Cited

U.S. PATENT DOCUMENTS

| | | | |
|---|---|---|---|
| 4,613,382 | 9/1986 | Katayama et al. | 148/1.5 |
| 5,122,431 | 6/1992 | Kodama et al. | 430/128 |
| 5,403,756 | 4/1995 | Yoshinouchi et al. | 437/24 |
| 5,620,906 | 4/1997 | Yamaguchi et al. | 436/162 |

FOREIGN PATENT DOCUMENTS

| | | |
|---|---|---|
| 62-45712 | 9/1987 | Japan . |
| 63-66970 | 3/1988 | Japan . |
| 3-57613 | 9/1991 | Japan . |
| 4-57098 | 9/1992 | Japan . |
| 6-1786 | 1/1994 | Japan . |

*Primary Examiner*—John F. Niebling
*Assistant Examiner*—Michael S. Lebentritt
*Attorney, Agent, or Firm*—Nixon & Vanderhye P.C.

[57] ABSTRACT

In the method for fabricating a TFT utilizing a polycrystalline silicon thin film as an intrinsic semiconductor region, a polycrystalline silicon thin film, a gate insulating film and a gate electrode are formed in this order on a substrate. An anodic oxide film is formed on a surface of the gate electrode for providing an offset thereto. The polycrystalline silicon thin film is then doped with hydrogen using the gate electrode having the offset as a mask to form hydrogen containing regions. The heating treatment for about one hour or more in a range of about 300° C. to about 450° C. is performed for hydrogenation of the polycrystalline silicon film. Impurities such as P or B are introduced to form contact regions ($n^+$ regions or $p^+$ regions) and then the introduced impurities are activated by irradiation of an excimer laser. An interlayer insulating film, source/drain electrodes and a protection film are further formed, thereby completing the TFT.

23 Claims, 8 Drawing Sheets

METHOD FOR PRODUCING A THIN FILM SEMICONDUCTOR DEVICE

BACKGROUND OF THE INVENTION

1. Field of the Invention

The present invention relates to a method for producing a thin film semiconductor device utilizing a polycrystalline silicon thin film. More particularly, the present invention relates to a method for producing a thin film semiconductor device such as a thin film transistor (hereinafter, simply referred to as a "TFT") that can be used as a switching element or in a peripheral driving circuit in a liquid crystal display (hereinafter, simply referred to as an "LCD").

2. Description of the Related Art

Recently, polycrystalline silicon thin film semiconductor devices utilizing polycrystalline silicon thin films as semiconductor layers, e.g., TFTs, are used in thin film transistor liquid crystal display devices (TFT-LCD devices), for example, as pixel transistors, or in peripheral driving circuits. However, such TFTs have a drawback in that a substantial amount of leakage current is generated during the OFF-period due to the material characteristics of the polycrystalline silicon thin film.

One of the major causes of such a leakage current is an avalanche current generated by an electric field concentration at the junctions of an intrinsic semiconductor region where it interfaces with impurity diffused regions (i.e., either the $n^+$ regions or the $p^+$ regions). Conventionally, in order to restrain such a phenomenon from occurring, an offset structure or an LDD (lightly doped drain) structure is formed.

Moreover, the polycrystalline silicon has a drawback in that it includes a great number of dangling bonds particularly in grain boundaries. Since these dangling bonds adversely affect the operating characteristics of the thin film semiconductor device as a transistor, it is necessary to embed ions such as hydrogen ions in the dangling bonds. This method is generally referred to as "hydrogenation".

Conventional hydrogenation of a polycrystalline silicon TFT is disclosed, for example, in the documents listed below. According to any one of these documents, the hydrogenation is performed after the formation of the impurity diffused regions (i.e., either the $n^+$ regions or the $p^+$ regions).

Japanese Patent Publication No. 6-1786 discloses a method in which hydrogen ions are implanted into an intrinsic semiconductor layer. In Japanese Patent Publication No. 3-57613, an intrinsic semiconductor layer is heated in a hydrogen atmosphere. In Japanese Patent Publication No. 62-45712, an intrinsic semiconductor layer is heated in a hydrogen plasma atmosphere. In Japanese Laid-Open Patent Publication No. 4-57098, a nitrogen silicon semiconductor layer is heated after forming a protection film of plasma nitrogen silicon.

Impurities such as phosphorus or boron are contained as dopants in a polycrystalline silicon film in order to form contact regions (i.e., either the $n^+$ regions or the $p^+$ regions) of a polycrystalline silicon TFT using a method that does not cause mass separation (e.g., an ion shower doping method or an ion implantation method). However, in such methods, the introduced impurities undesirably diffuse in a lateral direction toward a channel region in a subsequent heating process. Particularly, unlike in the case of single crystalline silicon, polycrystalline silicon includes grain boundaries along which the diffusion speed of the impurities is significantly faster compared with that inside the grains. Therefore, due to the lateral diffusion of the impurities toward the channel region, an effective offset length or LDD length may be undesirably shortened in the order of micrometers in the polycrystalline silicon TFTs.

Particularly, in the above-described conventional hydrogenation method, heat treatment for hydrogenation is conducted after forming the contact regions (either the $n^+$ regions or the $p^+$ regions), i.e., after introducing the impurities. Hence, the above-described lateral diffusion of the impurities, which causes an undesirable decrease in the offset length or the LDD length, is more likely to occur. As a result, the initial offset length or the initial LDD length must be set to such a value that allows for its expected decrease. However, setting the initial offset length or the initial LDD length to such a value prevents the size reduction of the TFT.

Moreover, a polycrystalline silicon TFT has a higher interface level concentration between a gate insulating film and the intrinsic semiconductor region compared with that of a single crystalline silicon TFT. Therefore, the impurities introduced in the contact regions (the $n^+$ regions or the $p^+$ regions) are more likely to undesirably diffuse in the lateral direction along the interface between the gate insulating film and the intrinsic semiconductor region. Therefore, when the channel length of the TFT is set to several micrometers or less for realizing the size reduction of the TFT, the gate voltage-drain current characteristic curve undesirably shifts. Specifically, in the case of an n-channel, the curve shifts in the negative direction; and in the case of a p-channel, the curve shifts in the positive direction.

Because of the above-described mechanisms, the conventional heat treatment for the hydrogenation, which is conducted after the formation of the contact regions, i.e., after the doping of the impurities, promotes undesirable diffusion of the impurities in the lateral direction. As a result, there is a limit in the shortening of the channel length and thus the size reduction of the TFT is also limited.

SUMMARY OF THE INVENTION

A method for producing a thin film semiconductor device according to the present invention, which uses a polycrystalline silicon thin film as an intrinsic semiconductor region, includes the steps of: forming a polycrystalline silicon thin film on a substrate; introducing hydrogen as a dopant into a prescribed region of the polycrystalline silicon thin film; performing hydrogenation of the polycrystalline silicon thin film using the introduced hydrogen to form a hydrogen containing region; introducing an impurity as a dopant into the hydrogen containing region to form an impurity diffused region; and completing the thin film semiconductor device.

The impurity diffused region can function as a contact region.

The prescribed region of the polycrystalline silicon thin film can be positioned in the vicinity of a region which is to be a channel region.

The prescribed region of the polycrystalline silicon thin film can be positioned so as to sandwich a region to be a channel region in a direction parallel to a top surface of the substrate.

The step of performing the hydrogenation may further include the step of heating the hydrogen containing region at a temperature in a range of about 300° C. to about 450° C.

According to another aspect of the present invention, a method for producing a thin film semiconductor device, which uses a polycrystalline silicon thin film as an intrinsic semiconductor region, includes the steps of: forming a polycrystalline silicon thin film on a substrate; simultaneously introducing hydrogen and an impurity as dopants into a prescribed region of the polycrystalline silicon thin film; performing hydrogenation of the polycrystalline silicon thin film using the introduced hydrogen; activating the introduced impurity to form an impurity diffused region; and completing the thin film semiconductor device.

The impurity diffused region can function as a contact region.

The prescribed region of the polycrystalline silicon thin film can be positioned in the vicinity of a region to be a channel region.

The prescribed region of the polycrystalline silicon thin film can be positioned so as to sandwich a region to be a channel region in a direction parallel to a top surface of the substrate.

The step of performing the hydrogenation can further include the step of heating the impurity diffused region at a temperature in a range of about 300° C. to about 450° C.

According to still another aspect of the present invention, a method for producing a thin film semiconductor device, which includes a polycrystalline silicon thin film as an intrinsic semiconductor region, includes the steps of: forming a polycrystalline silicon film on a substrate; forming an insulating region over the polycrystalline silicon film; forming a gate electrode region over the insulating region; forming an offset region over the gate electrode region; and forming a hydrogenated impurity region in the polycrystalline silicon film, wherein the gate electrode region and the offset region serve as a mask, thereby resulting in the hydrogenated impurity region being formed in the polycrystalline silicon film on either side of the gate electrode region and sandwiching a channel region therebetween.

The step of forming the polycrystalline silicon film may include the steps of: depositing an amorphous silicon film on a top surface of the substrate; and crystallizing the amorphous silicon film, thereby forming the polycrystalline silicon film over the top surface of the substrate.

The step of forming the insulating region may include the step of depositing an $SiO_2$ film having a thickness of about 100 nm over the polycrystalline silicon film via a plasma TEOS apparatus.

The step of forming the gate electrode region may include the steps of: depositing an Al film containing Ti having a thickness of about 300 nm on the insulating region; and etching the Al film containing Ti to form a gate electrode positioned above the polycrystalline silicon film having the insulating region interposed therebetween.

The step of forming the offset region may include the step of anodizing the gate electrode region to obtain an anodic oxide film having a thickness of less than 1 μm, thereby providing an offset for the gate electrode region.

The step of forming the hydrogenated impurity region may include the steps of: introducing hydrogen as a dopant into a prescribed region of the polycrystalline silicon film; performing hydrogenation of the polycrystalline silicon film using the introduced hydrogen to form a hydrogen containing region; introducing an impurity as a dopant into the hydrogen containing region to form an impurity diffused region; and activating the impurity diffused region.

The step of forming the hydrogenated impurity region may include the steps of: simultaneously introducing hydrogen and an impurity as dopants into a prescribed region of the polycrystalline silicon film; performing hydrogenation of the polycrystalline silicon thin film using the introduced hydrogen; and activating the introduced impurity to form the impurity diffused region.

The above-described method may further include the step of forming electrical contact regions to the impurity regions, thereby providing for electrical contact to be made to the thin film semiconductor device.

In the above-described method for producing a thin film semiconductor device according to the present invention, the hydrogenation is conducted prior to the formation of the impurity diffused region (i.e., either the $n^+$ region or the $p^+$ region) to minimize the defects in the polycrystalline silicon semiconductor layer and further in the gate insulating film and the intrinsic semiconductor region. As a result, the lateral diffusion of the introduced impurities towards the channel region in the subsequent heating process is minimized.

Thus, the invention described herein makes possible the advantage of providing a method for producing a thin film semiconductor device, which is capable of producing a TFT with a short offset length and a short channel length while enhancing the reliability and the operational characteristics thereof.

This and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

FIGS. 1A through 1I are cross-sectional views illustrating a method for producing a TFT 11 (FIG. 1I) according to a first example of the present invention.

Figure 1A:
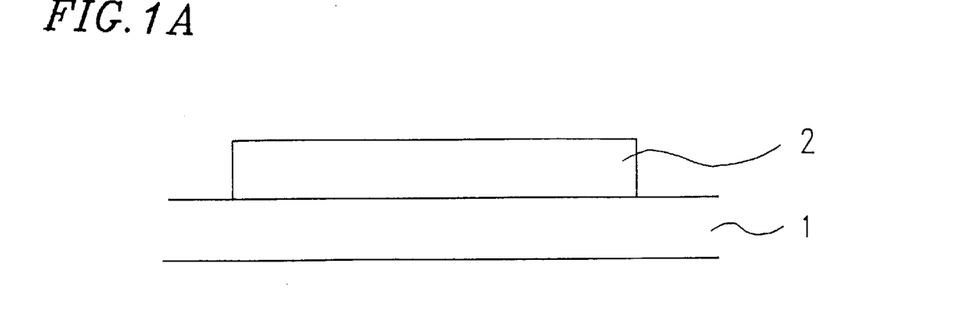
FIGS. 1A through 1I are cross-sectional views showing the steps of producing a TFT according to a first example of the present invention.

First, an amorphous silicon film is deposited on a top surface of a transparent insulating substrate 1 made of, for example, glass. The amorphous silicon film is formed by a known method in the art using a low pressure CVD apparatus or a plasma CVD apparatus to have a thickness of about 10 nm to 100 nm, typically about 50 nm. Then, the amorphous silicon film is crystallized to obtain a polycrystalline silicon film 2 by a known method in the art such as an SPC (solid phase crystallization) method, irradiation of an excimer laser, or a combination thereof. As shown in FIG. 1A, the polycrystalline silicon film 2 is patterned into a prescribed shape by photolithography and etching.

Figure 1B:
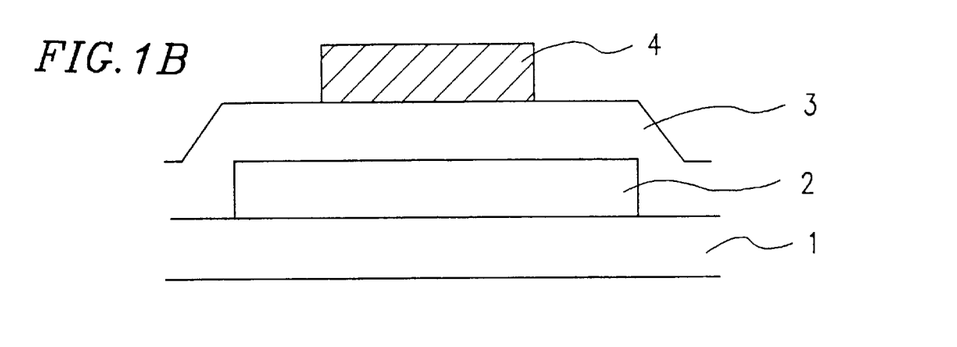

Then, as shown in FIG. 1B, an $SiO_2$ film is deposited on the insulating substrate 1 so as to cover the polycrystalline silicon film 2 to form a gate insulating film 3. The gate insulating film 3 is formed having a thickness of about 100 nm by using, for example, a plasma TEOS (tetra-ethyl-ortho-silicate) apparatus. An Al film containing Ti is then deposited on the gate insulating film 3, the gate insulating film 3 having a thickness of about 300 nm by using, for example, a sputtering apparatus. The Al film containing Ti is patterned into a prescribed shape by photolithography and etching to form a gate electrode 4 which is positioned so as to oppose the patterned polycrystalline silicon film 2 with the gate insulating film 3 interposed therebetween.

Figure 1C:
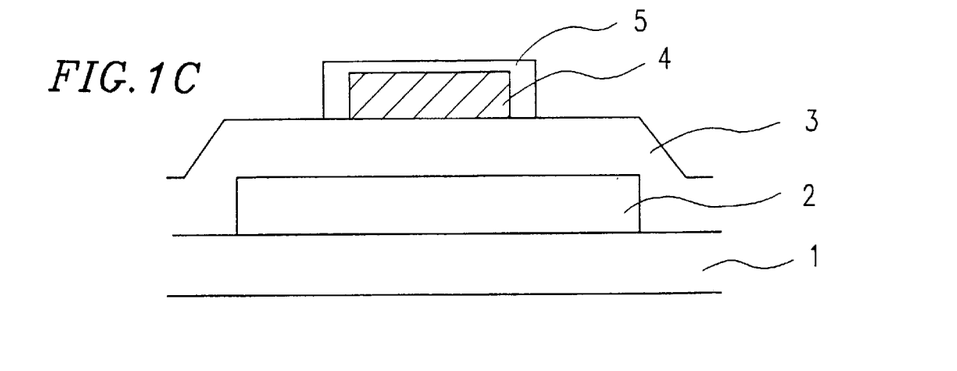

Thereafter, as shown in FIG. 1C, a surface area of the gate electrode 4 is anodized by a solution obtained by mixing approximately 3% ammonium tartrate and ethylene glycol at a ratio of about 1:9 to obtain an aluminum anodic oxide film 5. The aluminum anodic oxide film 5 is formed to have a thickness of about 1 $\mu$m or less, for example, about 100 nm. The anodic oxide film 5 is formed to act as an offset for the gate electrode 4. The thickness of the anodic oxide film 5 corresponds to the offset length.

Figure 1D:
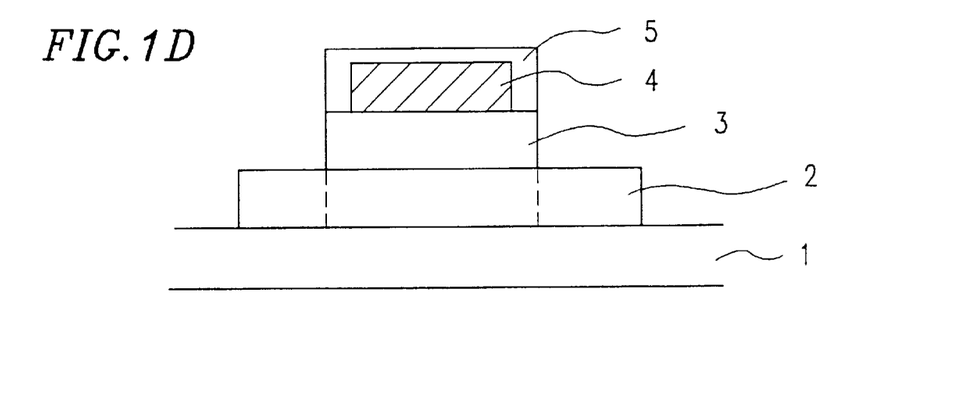

Then, as shown in FIG. 1D, the gate insulating film 3 is etched by using a mixture of nitric acid and hydrofluoric acid as an etchant so as to be patterned into a prescribed shape, using the gate electrode 4 having the offset of the anodic oxide film 5 as a mask.

Figure 1E:
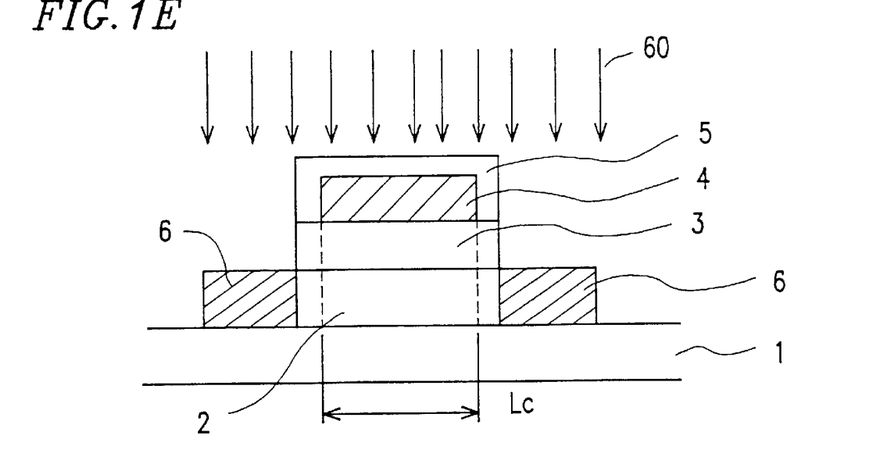

Then, as shown in FIG. 1E, portions of the polycrystalline silicon film 2, which are not covered with the gate electrode 4 and the anodic oxide film 5, are doped with hydrogen 60 to obtain hydrogen containing regions 6, by using an ion shower doping apparatus or an ion implantation apparatus and using the gate electrode 4 having the offset of the anodic oxide film 5 as a mask. Specifically, doping is conducted by implanting hydrogen ions into the polycrystalline silicon film 2 with an acceleration voltage of about 10 kV.

The concentration of the hydrogen 60 to be introduced into the polycrystalline silicon film 2 (the hydrogen containing region 6) is preferably about $10^{21}$ atoms/cm$^3$ or higher. The concentration of the hydrogen 60 to be introduced is set to be a value which is higher than a simulated value of trap level concentration in the polycrystalline silicon film and sufficiently low to allow the doping process to be completed within a practical period of time. Typically, the concentration of the hydrogen 60 to be introduced is approximately $10^{23}$ atoms/cm$^3$.

Then, the hydrogen containing regions 6 are heated at a temperature of about 300° C. to about 450° C. for about an hour or more for hydrogenation. Specifically, the heat treatment is conducted by means of resistance heating, lamp heating or infrared heating, and typically by means of resistance heating.

In the case where the heating temperature is lower than about 300° C., hydrogen hardly diffuses and thus little effect of the hydrogenation is obtained. On the other hand, in the case where the heating temperature is higher than about 450° C., the hydrogen which terminates the dangling bonds in the polycrystalline silicon is removed. For these reasons, the heating temperature for the hydrogenation is preferably in the aforementioned range of about 300° C. to about 450° C. Typically, the heat treating is conducted at a temperature of about 300° C. for about an hour.

In FIG. 1E, symbol Lc denotes the channel length. A region of the polycrystalline silicon film 2 which corresponds to the channel length Lc is a channel region. According to the present invention, the channel length Lc can be set to be about 2 $\mu$m to about 10 $\mu$m. Typically, the channel length Lc is set to be about 3 $\mu$m.

Figure 1F:
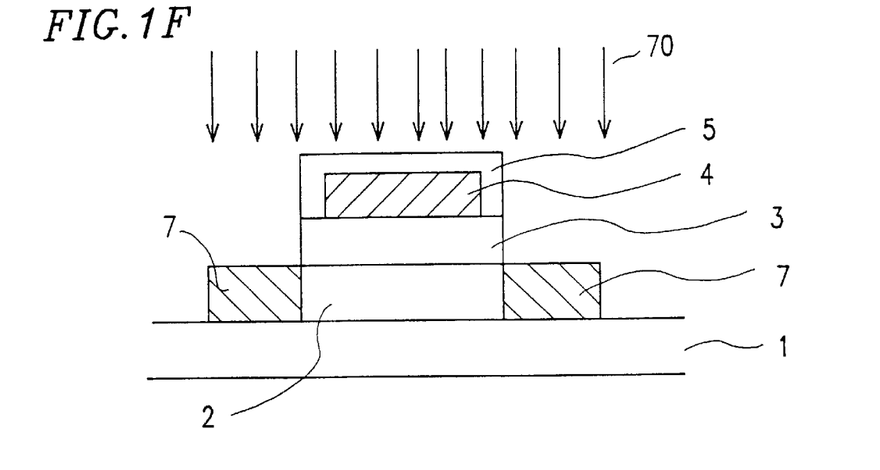

Then, as shown in FIG. 1F, the hydrogen containing regions 6 are doped with impurities 70 to form contact regions (either n$^+$-Si regions or p$^+$-Si regions) 7. The impurities 70 are introduced into the hydrogen containing regions 6 by an ion shower doping apparatus or an ion implantation apparatus, using the gate electrode 4 having the offset of the anodic oxide film 5 as a mask.

Thereafter, the introduced impurities are activated by a known method in the art such as irradiation by an excimer laser. In the case of the irradiation by the excimer laser, an excimer laser beam having a wavelength of 248 nm and an energy of about 300 mJ/cm$^2$ is typically radiated for about several tens of nanoseconds.

For example, phosphorus can be used as the impurities 70 to obtain the n$^+$-Si regions, and boron can be used as the impurities 70 to obtain the p$^+$-Si regions. Moreover, the concentration of the impurities introduced in the contact regions 7 is preferably about $10^{21}$ atoms/cm$^2$ or higher. This value is obtained by an experiment as a value that gives a sufficiently low resistivity of the obtained contact regions 7. For example, in the case where phosphorus or boron is used as the impurities 70, the concentration of the impurities contained in the contact regions 7 is typically about $10^{23}$ atoms/cm$^2$.

Specifically, in the case of phosphorus or boron, the doping is conducted by implanting either phosphorus or boron ions into the hydrogen containing regions 6 with an acceleration voltage of about 10 kV.

Figure 1G:
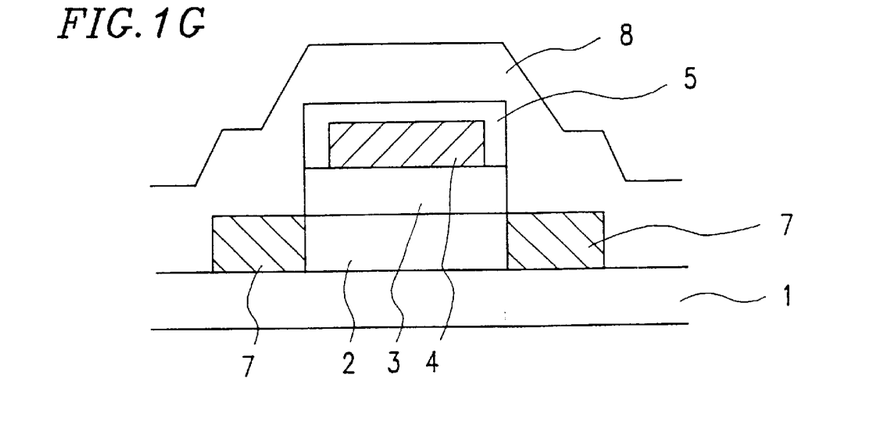

Thereafter, as shown in FIG. 1G, an $SiO_2$ film is deposited on the resultant layers to obtain an interlayer insulating film 8. The interlayer insulating film 8 is formed having a thickness of about 400 nm by using, for example, a plasma TEOS apparatus.

Figure 1H:
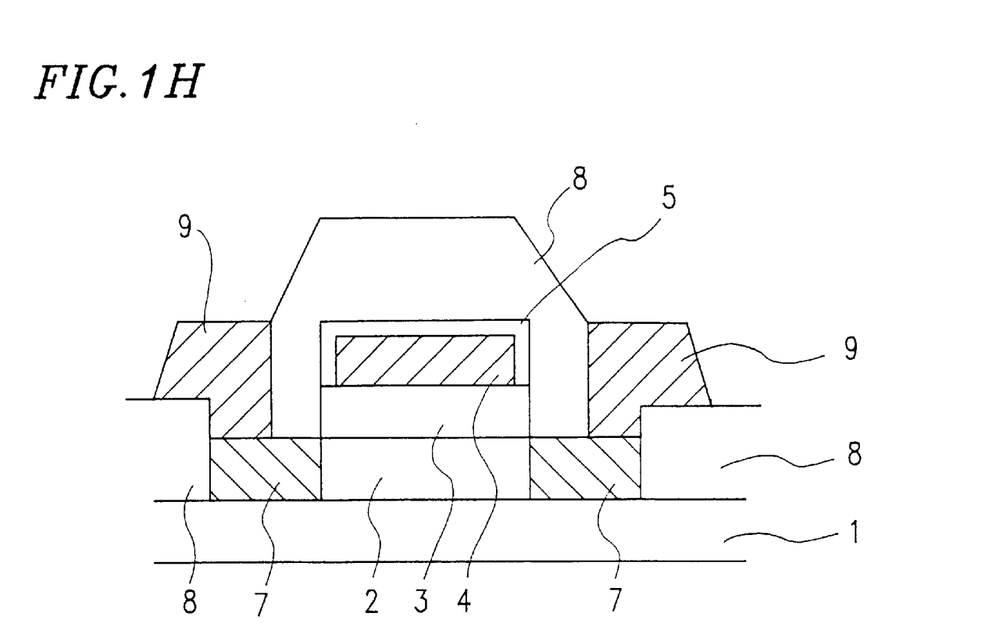

Moreover, as shown in FIG. 1H, contact holes are formed in the interlayer insulating film 8 by photolithography and etching so as to reach the contact regions 7. Then, an Al film containing Ti is formed to a thickness of about 350 nm to fill the contact holes and to be in contact with the contact regions 7 by using, for example, a sputtering apparatus, thereby obtaining source and drain electrodes 9.

Figure 1I:
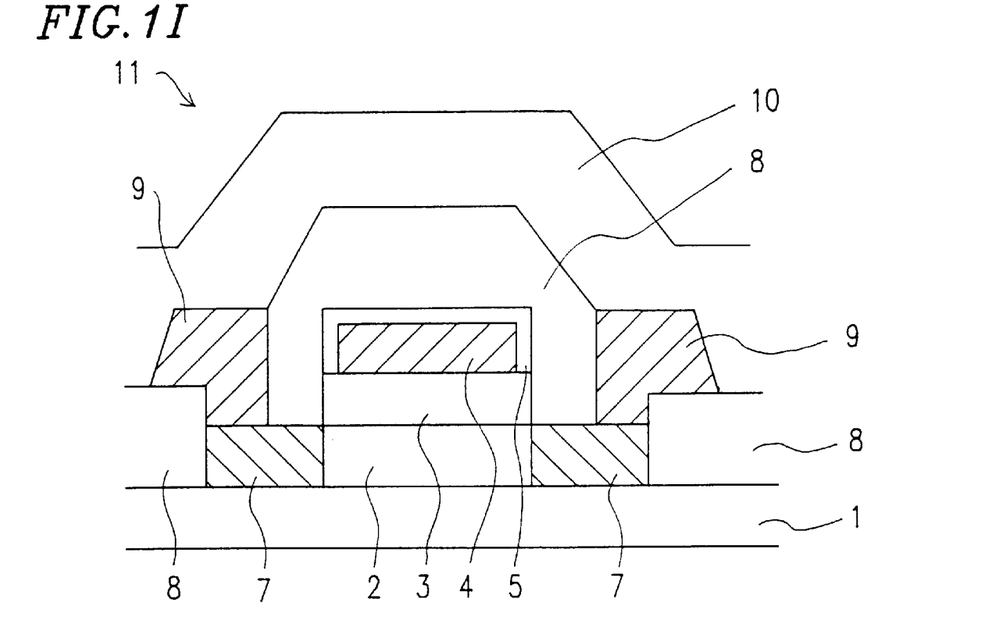

As shown in FIG. 1I, a protection film 10 made of, for example, silicon nitride having a thickness of about 300 nm is formed so as to cover the resultant layers by using, for example, a plasma CVD apparatus.

In this manner, the TFT 11 is completed.

Figure 2:
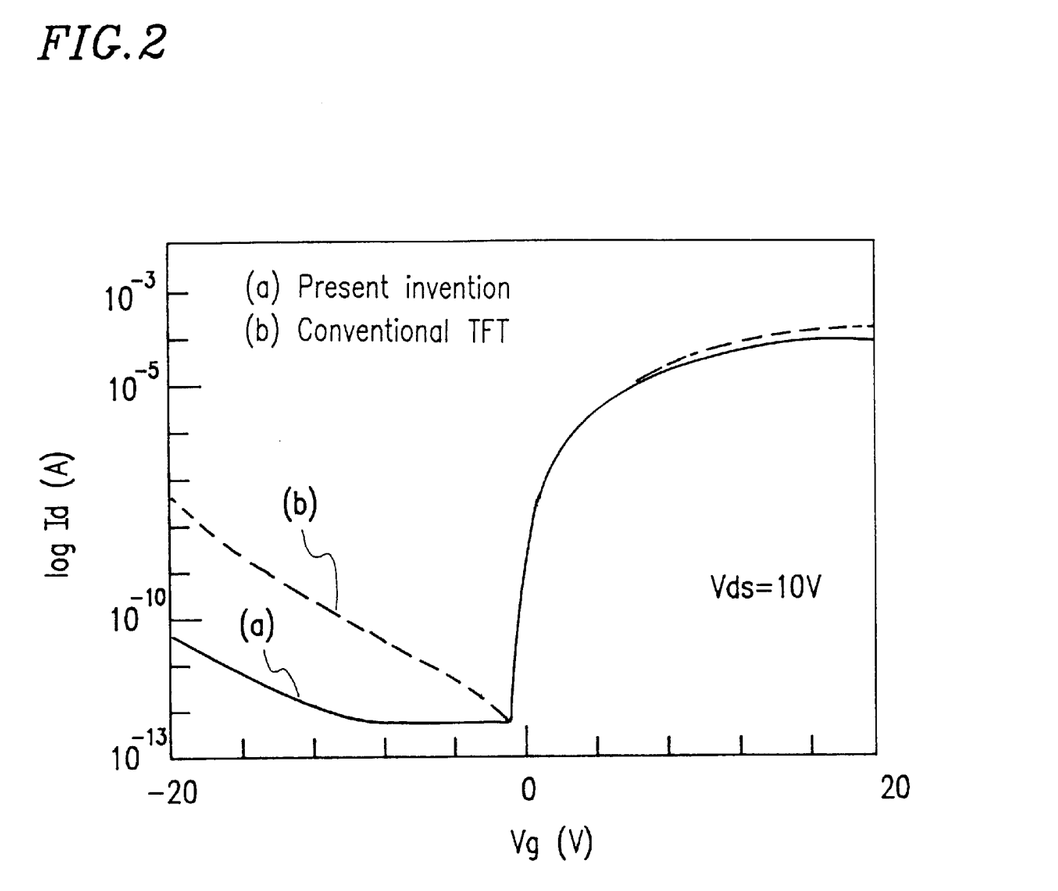
FIG. 2 is a graph showing the operational characteristics of a TFT produced by a conventional method and a TFT produced by a method according to the present invention.

FIG. 2 is a graph showing the operating characteristics of a TFT produced by a conventional method and a TFT produced by a method according to the present invention. The horizontal axis represents the gate voltage Vg in a linear scale, and the vertical axis represents the drain current Id in a logarithmic scale. The drain voltage Vds is maintained at 10 V.

In FIG. 2, curve (a) represents the Vg vs. log Id characteristic of the TFT formed by the method described in the first example of the present invention; and curve (b) represents the Vg vs. log Id characteristic of the TFT formed by a conventional method which is provided for comparison. As can be appreciated from FIG. 2, the OFF-state current value can be decreased with only a little decrease in the ON-state current value in the TFT produced by the method according to the present invention since the TFT has a shorter offset length compared with the TFT produced by the conventional method.

Figure 3:
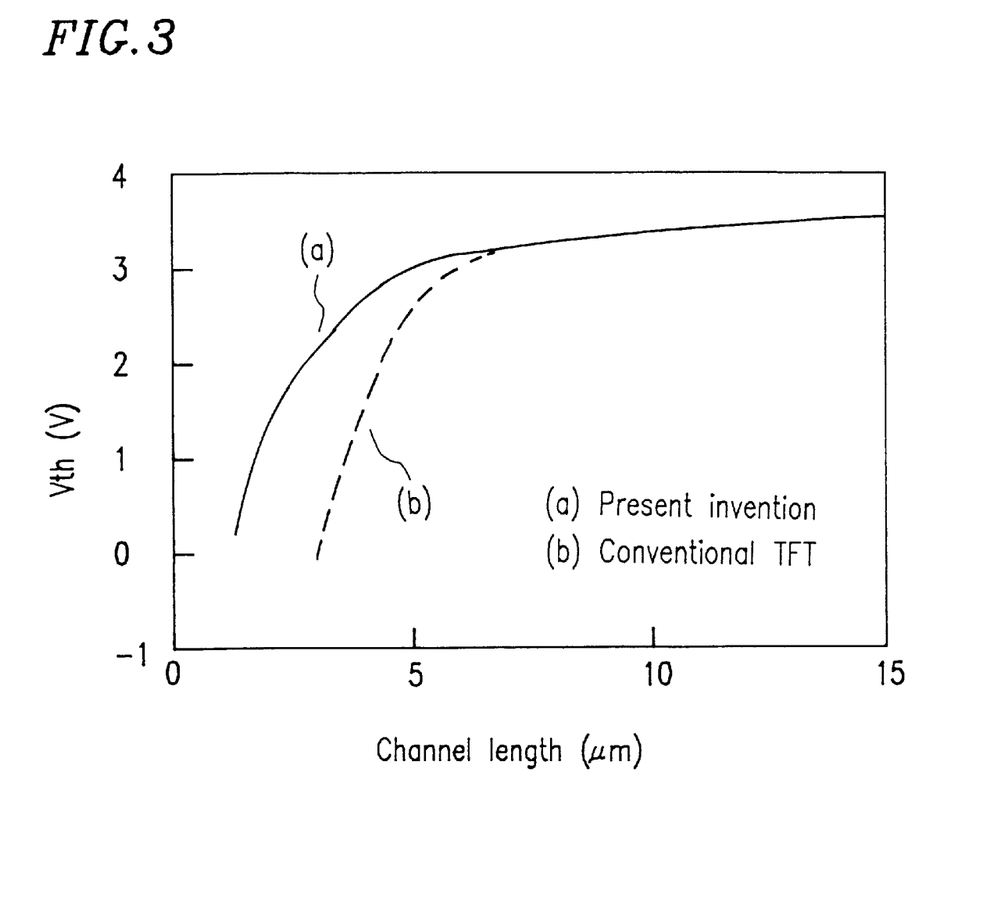
FIG. 3 is a graph showing the dependency of the threshold voltage on the channel length for a TFT produced by a conventional method and for a TFT produced by a method according to the present invention.

FIG. 3 is a graph showing the dependency of the threshold voltage Vth on the channel length of a TFT produced by a conventional method and a TFT produced by a method according to the present invention. The horizontal axis represents the channel length, and the vertical axis represents the threshold voltage Vth. Curve (a) represents the dependency of the TFT produced by a method according to the present invention; and curve (b) represents the dependency of the TFT formed by the conventional method which is provided for comparison.

Generally, in the case of a TFT in which polycrystalline silicon is used, a shift in a threshold voltage Vth (referred to as a "Vth shift") occurs as the channel length becomes shorter. For example, in the case of the conventional TFT represented by curve (b), when the channel length is about 4 μm or less, the TFT begins operating in a depletion mode. However, as can be seen by curve (a), the TFT formed by a method according to the present invention does not begin operating in a depletion mode until the channel length becomes about 2 μm or less.

According to a method for producing the TFT 11 in the first example of the present invention, the polycrystalline silicon film 2 is subjected to the hydrogenation prior to the formation of the contact regions 7 (either the $n^+$-Si regions or the $p^+$-Si regions). Therefore, undesirable impurity diffusion toward the channel region is not caused by the heat treatment performed for the hydrogenation. Consequently, the offset length and the channel length can be set to be shorter than those of the TFT produced by the conventional method. For example, the channel length can be set to be about 3 μm by the method according to the present invention while it is typically about 6 μm by the conventional method. Similarly, the offset length can be set to be 1 μm or less by the method according to the present invention where it is typically about 1 μm by the conventional method.

As a result, the size of the TFT 11 can be reduced without causing a deficiency in the operational characteristics thereof.

EXAMPLE 2

FIGS. 4A through 4H are cross-sectional views illustrating a method for producing a TFT 12 (FIG. 4H) according to a second example of the present invention.

Figure 4A:
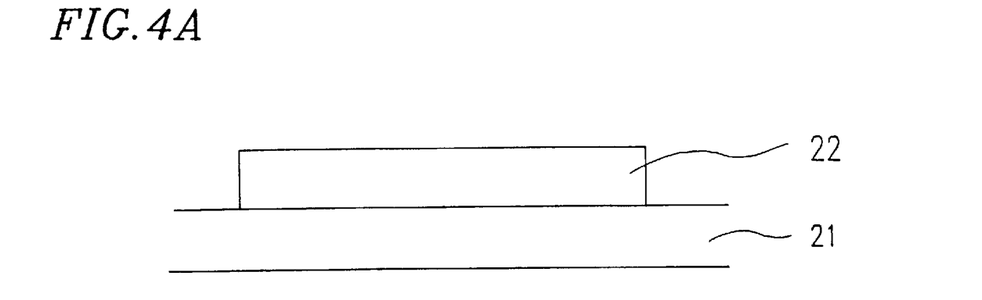
FIGS. 4A through 4H are cross-sectional views showing the steps of producing a TFT according to a second example of the present invention.

First, an amorphous silicon film is deposited on a top surface of a transparent insulating substrate 21 made of, for example, glass. The amorphous silicon film is formed by a known method in the art using a low pressure CVD apparatus or a plasma CVD apparatus to have a thickness of about 10 nm to 100 nm, typically about 50 nm. Then, the amorphous silicon film is crystallized to obtain a polycrystalline silicon film 22 by a known method in the art such as an SPC (solid phase crystallization) method, irradiation by an excimer laser, or a combination thereof. As shown in FIG. 4A, the polycrystalline silicon film 22 is patterned into a prescribed shape by photolithography and etching.

Figure 4B:
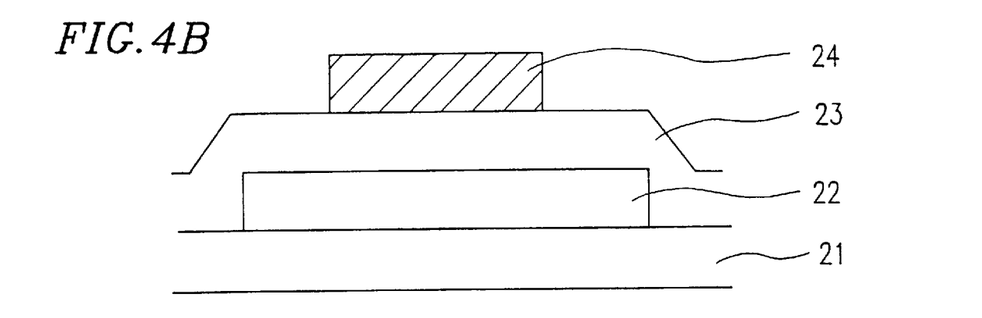

Then, as shown in FIG. 4B, an $SiO_2$ film is deposited on the insulating substrate 21 so as to cover the polycrystalline silicon film 22 to form a gate insulating film 23. The gate insulating film 23 is formed having a thickness of about 100 nm by using, for example, a plasma TEOS apparatus. An Al film containing Ti is deposited on the gate insulating film 23 to have a thickness of about 300 nm by using, for example, a sputtering apparatus. The Al film containing Ti is patterned into a prescribed shape by photolithography and etching to be a gate electrode 24 which is positioned so as to oppose the patterned polycrystalline silicon film 22 with the gate insulating film 23 interposed therebetween.

Figure 4C:
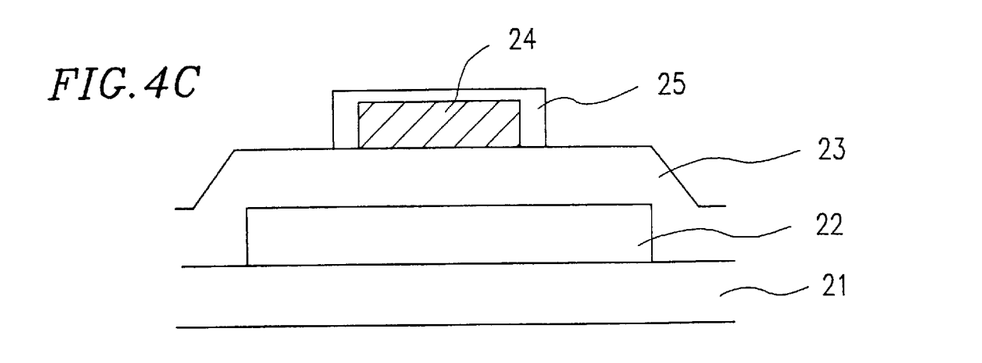

Thereafter, as shown in FIG. 4C, a surface area of the gate electrode 24 is anodized by a solution obtained by mixing approximately 3% ammonium tartrate and ethylene glycol at a ratio of about 1:9 to obtain an aluminum anodic oxide film 25. The aluminum anodic oxide film 25 is formed to have a thickness of about 1 μm or less, for example, about 100 nm. The anodic oxide film 25 is formed to act as an offset for the gate electrode 24. The thickness of the anodic oxide film 25 corresponds to the offset length.

Figure 4D:
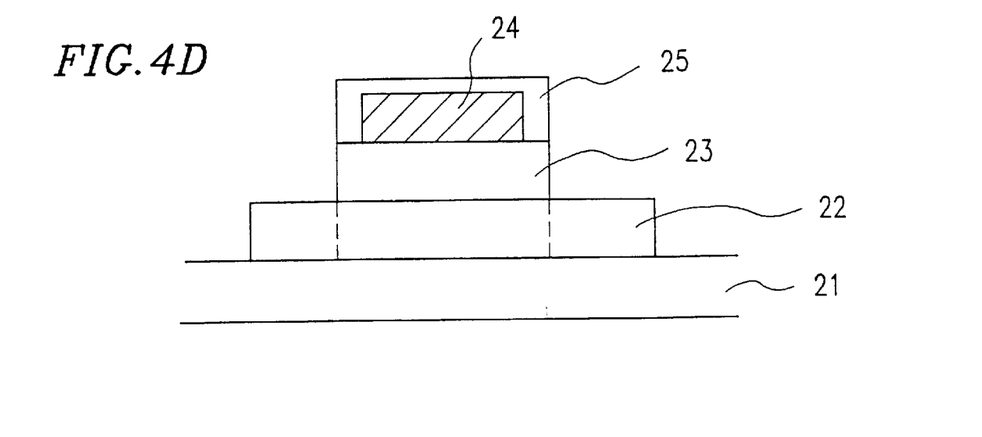

Then, as shown in FIG. 4D, the gate insulating film 23 is etched by using a mixture of nitric acid and hydrofluoric acid as an etchant so as to be patterned into a prescribed shape, using the gate electrode 24 having the offset of the anodic oxide film 25 as a mask.

Figure 4E:
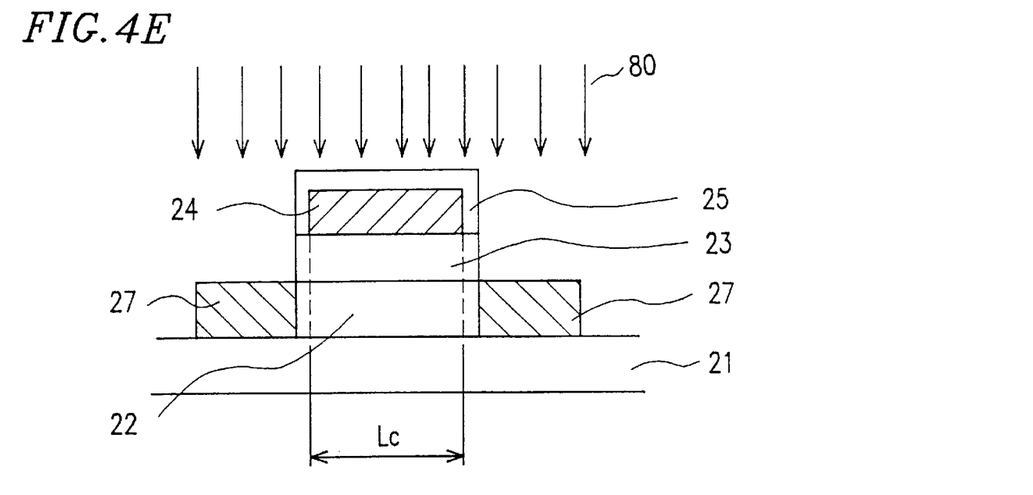

Then, as shown in FIG. 4E, portions of the polycrystalline silicon film 22, which are not covered with the gate electrode 24 and the anodic oxide film 25, are doped with hydrogen containing impurities 80 to obtain contact regions (either $n^+$-Si regions or $p^+$-Si regions) 27, by using an ion shower doping apparatus and using the gate electrode 24 having the offset of the anodic oxide film 25 as a mask. Specifically, the contact regions 27 are formed by simultaneously introducing impurities and hydrogen into the polycrystalline silicon film 22.

The concentration of the hydrogen to be introduced into the polycrystalline silicon film 22 is preferably about $10^{20}$ atoms/cm$^3$ or higher. The concentration of the hydrogen is set to be a value which is higher than a simulated value of trap level concentration in the polycrystalline silicon film and sufficiently low to allow the doping process to be completed within a practical period of time. Typically, the concentration of the hydrogen to be introduced is approximately $10^{23}$ atoms/cm$^3$.

For example, phosphorus can be used as the impurities to obtain the $n^+$-Si regions, and boron can be used as the impurities to obtain the $p^+$-Si regions. Moreover, the concentration of the impurities introduced in the contact regions 27 is preferably about $10^{20}$ atoms/cm$^2$ or higher. This value is obtained by an experiment as a value that gives a sufficiently low resistivity of the obtained contact regions 27. For example, in the case where phosphorus or boron is used as the impurities, the concentration of the impurities contained in the contact regions 27 is typically about $10^{23}$ atoms/cm$^2$.

Specifically, in the case of either phosphorus or boron, the doping is conducted by implanting either phosphorus and hydrogen ions or boron and hydrogen ions into the polycrystalline silicon film 22 with an acceleration voltage of about 10 kV.

Then, the contact regions 27 are then heated at a temperature of about 300° C. to about 450° C. for about an hour or more for hydrogenation. Specifically, the heat treatment is conducted by means of resistance heating, lamp heating or infrared heating, and typically by means of resistance heating.

In the case where the heating temperature is lower than about 300° C., hydrogen hardly diffuses and thus little effect of the hydrogenation is obtained. On the other hand, in the case where the heating temperature is higher than about 450° C., the hydrogen which terminates the dangling bonds in the polycrystalline silicon is removed. For these reasons, the heating temperature for the hydrogenation is preferably in the range of about 300° C. to about 450° C. Typically, the heat treatment is conducted at a temperature of about 300° C. for about an hour.

Thereafter, the introduced impurities are activated by a known method in the art such as irradiation by an excimer laser. In the case of the irradiation by the excimer laser, an excimer laser beam having a wavelength of 248 nm and an energy of about 300 mJ/cm² is typically radiated for about several tens of nanoseconds.

In FIG. 4E, symbol Lc denotes the channel length. A region of the polycrystalline silicon film 22 which corresponds to the channel length Lc is a channel region. According to the present invention, the channel length Lc can be set to be about 2 μm to about 10 μm. Typically, the channel length Lc is set to be about 3 μm.

Figure 4F:
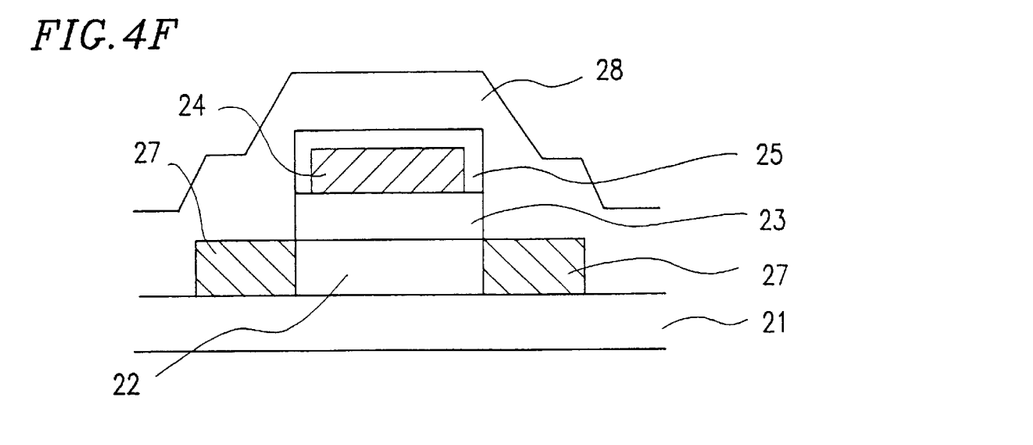

Then, as shown in FIG. 4F, an SiO₂ film is deposited on the resultant layers to obtain an interlayer insulating film 28. The interlayer insulating film 28 is formed having a thickness of about 400 nm by using, for example, a plasma TEOS apparatus.

Figure 4G:
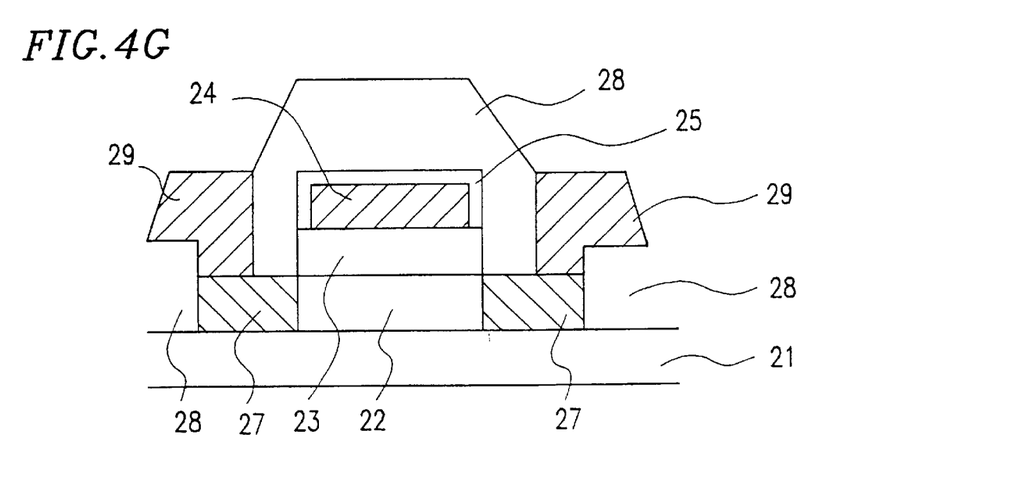

Moreover, as shown in FIG. 4G, contact holes are formed in the interlayer insulating film 28 by photolithography and etching so as to reach the contact regions 27. Then, an Al film containing Ti is formed to a thickness of about 350 nm to fill the contact holes and to be in contact with the contact regions 27 by using, for example, a sputtering apparatus, thereby obtaining source and drain electrodes 29.

Figure 4H:
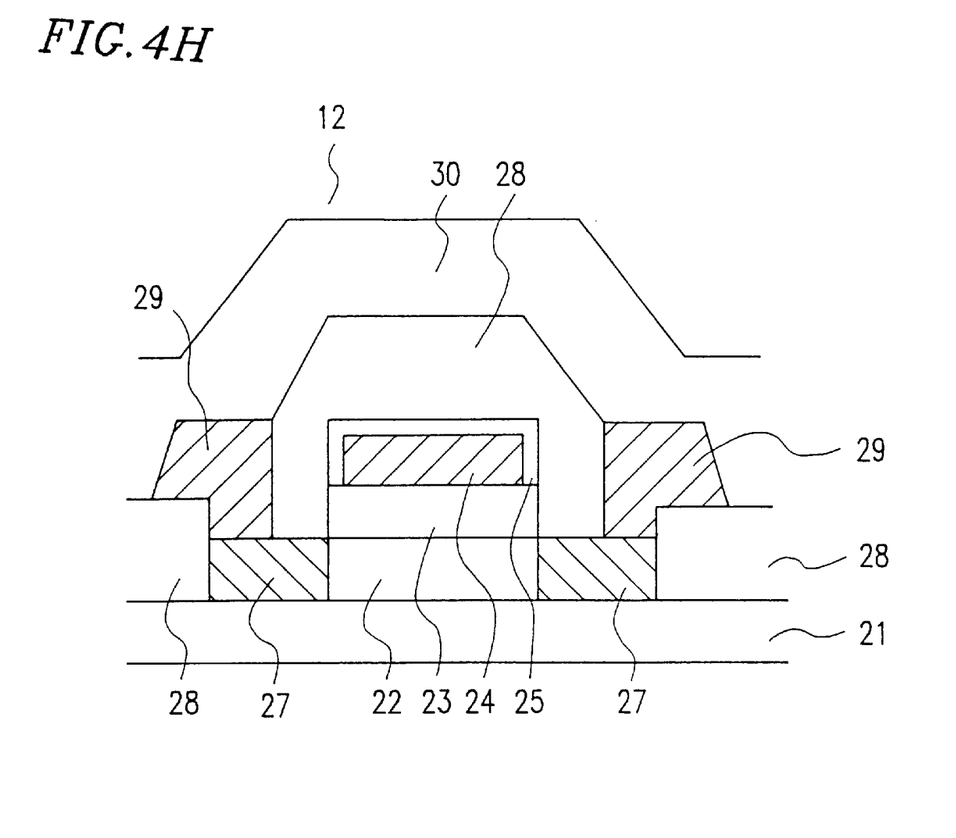

As shown in FIG. 4H, a protection film 30 made of, for example, silicon nitride having a thickness of about 300 nm is formed so as to cover the resultant layers by using, for example, a plasma CVD apparatus.

In this manner, the TFT 12 is produced.

The TFT 12 which is produced in the above-described manner in the second example has the same operational characteristics as the TFT 11 in the first example described with reference to FIGS. 2 and 3. Furthermore, the production process of the second example has the same effect as that in the first example.

According to the second example, since the impurities and hydrogen are introduced simultaneously, the number of production steps are reduced and thus the time required for the production is shortened, resulting in higher efficiency for the production process. The impurities and the hydrogen can be introduced at the same time without causing a deficiency since the hydrogenation is conducted prior to the activation of the impurities.

As set forth above, according to a method for producing a thin semiconductor film device of the present invention, the hydrogenation is conducted prior to the formation of the impurity diffused region (either the n⁺ regions or the p⁺ regions) in order to minimize the above-described deficiency in the polycrystalline silicon semiconductor layer. This effect is maintained after doping the prescribed portions of the polycrystalline silicon semiconductor layer with the impurities to form the n⁺/p⁺ regions and the intrinsic semiconductor region. As a result, the deficiency in the resultant intrinsic semiconductor region is also reduced. Furthermore, hydrogen diffuses in various directions during the fabrication process to go into the gate insulating film, resulting in the deficiency therein such as the one derived from its structure, e.g., unsaturated bonding caused by broken Si—O bonding or an impurity (specifically, the deficiency at the interface between the gate insulating film and the intrinsic semiconductor region, which forms interface state there) being reduced. Thus, the lateral diffusion of the introduced impurities toward the channel region due to the subsequent heating process is reduced.

As a result, according to a method for producing a thin semiconductor film device of the present invention, a TFT having a short offset length and a short channel length can be produced while enhancing the reliability and the operational characteristics thereof.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for producing a thin film semiconductor device including a polycrystalline silicon thin film as an intrinsic semiconductor region, comprising the steps of:

forming a polycrystalline silicon thin film on a substrate;

introducing hydrogen as a dopant into a prescribed region of the polycrystalline silicon thin film;

performing hydrogenation of the polycrystalline silicon thin film using the introduced hydrogen to form a hydrogen containing region;

introducing an impurity as a dopant into the hydrogen containing region to form an impurity diffused region; and completing the thin film semiconductor device.

2. A method according to claim 1, wherein the impurity diffused region functions as a contact region.

3. A method according to claim 1, wherein the prescribed region of the polycrystalline silicon thin film is positioned in the vicinity of a region which is to be a channel region.

4. A method according to claim 1, wherein the prescribed region of the polycrystalline silicon thin film is positioned so as to sandwich a region to be a channel region in a direction parallel to a top surface of the substrate.

5. A method according to claim 1, wherein the step of performing the hydrogenation further comprises the step of heating the hydrogen containing region at a temperature in a range of about 300° C. to about 450° C.

6. A method for producing a thin film semiconductor device using a polycrystalline silicon thin film as an intrinsic semiconductor region, comprising the steps of:

forming a polycrystalline silicon thin film on a substrate;

simultaneously introducing hydrogen and an impurity as dopants into a prescribed region of the polycrystalline silicon thin film;

performing hydrogenation of the polycrystalline silicon thin film using the introduced hydrogen;

activating the introduced impurity to form an impurity diffused region; and completing the thin film semiconductor device.

7. A method according to claim 6, wherein the impurity diffused region functions as a contact region.

8. A method according to claim 6, wherein the prescribed region of the polycrystalline silicon thin film is positioned in the vicinity of a region to be a channel region.

9. A method according to claim 6, wherein the prescribed region of the polycrystalline silicon thin film is positioned so as to sandwich a region to be a channel region in a direction parallel to a top surface of the substrate.

10. A method according to claim 6, wherein the step of performing the hydrogenation further comprises the step of heating the impurity diffused region at a temperature in a range of about 300° C. to about 450° C.

11. A method for producing a thin film semiconductor device including a polycrystalline silicon thin film as an intrinsic semiconductor region, comprising the steps of:

forming a polycrystalline silicon film on a substrate;

forming an insulating region over the polycrystalline silicon film;

forming a gate electrode region over the insulating region;

forming an offset region over the gate electrode region; and forming a hydrogenated impurity region in the polycrystalline silicon film, wherein the gate electrode region and the offset region serve as a mask, thereby resulting in the hydrogenated impurity region being formed in the polycrystalline silicon film on either side of the gate electrode region and sandwiching a channel region therebetween, wherein in the step of forming the hydrogenated impurity region, a hydrogenating process using introduced hydrogen is conducted prior to a process for activating an introduced impurity.

12. A method according to claim 11, wherein the step of forming the polycrystalline silicon film comprises the steps of:

depositing an amorphous silicon film on a top surface of the substrate; and crystallizing the amorphous silicon film, thereby forming the polycrystalline silicon film over the top surface of the substrate.

13. A method according to claim 11, wherein the step of forming the insulating region comprises the step of depositing an $SiO_2$ film having a thickness of about 100 nm over the polycrystalline silicon film via a plasma TEOS apparatus.

14. A method according to claim 11, wherein the step of forming the gate electrode region comprises the steps of:

depositing an Al film containing Ti having a thickness of about 300 nm on the insulating region; and etching the Al film containing Ti to form a gate electrode positioned above the polycrystalline silicon film having the insulating region interposed therebetween.

15. A method according to claim 11, wherein the step of forming the offset region comprises the step of anodizing the gate electrode region to obtain an anodic oxide film having a thickness of less than 1 $\mu$m, thereby providing an offset for the gate electrode region.

16. A method according to claim 11, wherein the step of forming the hydrogenated impurity region comprises the steps of:

introducing hydrogen as a dopant into a prescribed region of the polycrystalline silicon film;

performing hydrogenation of the polycrystalline silicon film using the introduced hydrogen to form a hydrogen containing region;

introducing an impurity as a dopant into the hydrogen containing region to form an impurity diffused region; and activating the impurity diffused region.

17. A method according to claim 11, wherein the step of forming the hydrogenated impurity region comprises the steps of:

simultaneously introducing hydrogen and an impurity as dopants into a prescribed region of the polycrystalline silicon film;

performing hydrogenation of the polycrystalline silicon thin film using the introduced hydrogen; and activating the introduced impurity to form the impurity diffused region.

18. A method according to claim 11, further comprising the step of forming electrical contact regions to the impurity regions, thereby providing for electrical contact to be made to the thin film semiconductor device.

19. A method for producing a semiconductor device, comprising the steps of:

forming a mask on a portion of a semiconductor region corresponding to a channel region of said semiconductor device;

introducing hydrogen and an impurity into said semiconductor region using said mask;

hydrogenating the semiconductor region;

activating the impurity to form impurity diffused regions after hydrogenating the semiconductor region; and completing the thin film semiconductor device.

20. The method according to claim 19, wherein the hydrogen and the impurity are introduced simultaneously.

21. The method according to claim 19, wherein the mask comprises a gate electrode of the semiconductor device, the gate electrode being insulated from the semiconductor region.

22. The method according to claim 21, wherein the mask further comprises an offset region formed on said gate electrode.

23. The method according to claim 19, wherein the step of completing the device comprises forming contacts to the impurity diffused regions.

* * * * *